(12) United States Patent
Saimei et al.

(10) Patent No.: US 8,933,497 B2
(45) Date of Patent: Jan. 13, 2015

(54) SEMICONDUCTOR SWITCH DEVICE AND METHOD OF MANUFACTURING SEMICONDUCTOR SWITCH DEVICE

(75) Inventors: Tsunekazu Saimei, Kyoto-fu (JP);
Kazuya Kobayashi, Kyoto-fu (JP);
Koshi Himeda, Kyoto-fu (JP);
Nobuyoshi Okuda, Kyoto-fu (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 13/296,842

(22) Filed: Nov. 15, 2011

(65) Prior Publication Data

US 2012/0091513 A1      Apr. 19, 2012

Related U.S. Application Data

(63) Continuation of application No. PCT/JP2010/058173, filed on May 14, 2010.

(30) Foreign Application Priority Data

May 19, 2009   (JP) ................................ 2009-120720

(51) Int. Cl.
*H01L 27/085*     (2006.01)
*H01L 27/088*     (2006.01)
(Continued)

(52) U.S. Cl.
CPC ........ *H01L 27/0883* (2013.01); *H01L 27/0605* (2013.01); *H01L 27/095* (2013.01);
(Continued)

(58) Field of Classification Search
CPC ................... H01L 27/0883; H01L 21/28587; H01L 29/8128

USPC ......... 438/275, 58, FOR. 218, 576, 701, 574, 438/579; 257/E27.061, 330

See application file for complete search history.

(56) References Cited

U.S. PATENT DOCUMENTS

| | | |
|---|---|---|
| 5,534,452 A | 7/1996 | Nakanishi et al. |
| 6,936,870 B2 | 8/2005 | Nishihori et al. |

(Continued)

FOREIGN PATENT DOCUMENTS

| | | |
|---|---|---|
| EP | 1261035 A2 | 11/2002 |
| JP | S55-19881 A | 2/1980 |

(Continued)

OTHER PUBLICATIONS

Hur et al., Development of Double Recessed AlInAs/GaInAs/InP HEMTs for Millimeter Wave Power Applications, 1997, Solid-State Electronics, 41, 1581-1585.*

(Continued)

*Primary Examiner* — Dale E Page
(74) *Attorney, Agent, or Firm* — Studebaker & Brackett PC

(57) ABSTRACT

A semiconductor switch device and a method of manufacturing the semiconductor switch device are provided. The semiconductor switch device includes semiconductor elements on a single semiconductor substrate. At least one of the semiconductor elements constitutes a switch circuit and at least one other of the semiconductor elements constitutes a logic (connection) circuit. Each semiconductor element includes a recess, a gate electrode in the recess, a drain electrode, and a source electrode. In one representative aspect, the gate electrode in the switch circuit can have a rectangular external shape in section, and the gate electrode in the connection circuit has a shape in section other than rectangular.

9 Claims, 7 Drawing Sheets

(51) Int. Cl.
*H01L 27/06* (2006.01)
*H01L 27/095* (2006.01)
*H01L 29/423* (2006.01)
*H01L 29/66* (2006.01)
*H01L 29/812* (2006.01)
H01L 21/8234 (2006.01)
H01L 29/20 (2006.01)

(52) U.S. Cl.
CPC .... *H01L29/42316* (2013.01); *H01L 29/66863* (2013.01); *H01L 29/812* (2013.01); H01L 21/823456 (2013.01); H01L 29/20 (2013.01)
USPC ............... 257/265; 257/E27.061; 257/330; 438/275; 438/58; 438/576

(56) References Cited

U.S. PATENT DOCUMENTS

| | | | |
|---|---|---|---|
| 7,087,957 | B2 | 8/2006 | Matsuda |
| 7,829,957 | B2 | 11/2010 | Kato et al. |
| 2002/0171076 | A1 | 11/2002 | Danzilio |
| 2004/0164317 | A1 | 8/2004 | Nishihori et al. |
| 2005/0206439 | A1 | 9/2005 | Struble |
| 2006/0027840 | A1* | 2/2006 | Wohlmuth ............... 257/267 |
| 2008/0179630 | A1* | 7/2008 | Atherton ............... 257/192 |

FOREIGN PATENT DOCUMENTS

| | | |
|---|---|---|
| JP | 63-299514 A | 12/1988 |
| JP | H01-187978 A | 7/1989 |
| JP | 06-216327 A | 8/1994 |
| JP | 06216327 A * | 8/1994 |
| JP | H06-216327 A | 8/1994 |
| JP | H06216327 A | 8/1994 |
| JP | 08-111424 A | 4/1996 |
| JP | 11-040578 A | 2/1999 |
| JP | 2000-277703 A | 10/2000 |
| JP | 3236386 B2 | 9/2001 |
| JP | 2002-134736 A | 5/2002 |
| JP | 2005-203642 A | 7/2005 |
| JP | 2007-194411 A | 8/2007 |
| JP | 2008-034406 A | 2/2008 |
| JP | 4064800 B2 | 3/2008 |
| JP | 2008-263146 A | 10/2008 |

OTHER PUBLICATIONS

International Search Report; PCT/JP2010/058173; Aug. 10, 2010.
Written Opinion of the International Searching Authority; PCT/JP2010/058173; Aug. 10, 2010.
The extended European search report issued on Mar. 27, 2014, which corresponds to European Patent Application No. 10777701.3-1552 and is related to U.S. Appl. No. 13/296,842.
"Notification of Reasons for Rejection," issued by the Japanese Patent Office on Oct. 22, 2013, which corresponds to Japanese Patent Application No. 2011-514391 and is related to U.S. Appl. No. 13/296,842; with English language translation.
An Office Action issued by the State Intellectual Property Office of People's Republic of China on Aug. 15, 2013, which corresponds to Chinese Patent Application No. 201080021654.2 and is related to U.S. Appl. No. 13/296,842.

* cited by examiner

US 8,933,497 B2

SEMICONDUCTOR SWITCH DEVICE AND METHOD OF MANUFACTURING SEMICONDUCTOR SWITCH DEVICE

CROSS REFERENCE TO RELATED APPLICATIONS

The present application is a of continuation International Application No. PCT/JP2010/058173 filed May 14, 2010, which claims priority to Japanese Patent Application No. 2009-120720 filed May 19, 2009, the entire contents of each of these applications being incorporated herein by reference in their entirety.

TECHNICAL FIELD

The present invention relates to a semiconductor switch device in which a switch circuit, etc. are constituted by using semiconductor elements, such as an FET (Field Effect Transistor), and to a method of manufacturing the semiconductor switch device.

BACKGROUND

Transition from the second-generation cellular phone system to the third-generation cellular phone system is now in progress. With such system transition, an integrated circuit fabricated by integrating a logic circuit, an amplification circuit, etc. with the switch circuit is employed in front-end portions of the cellular phones in increasing number.

In that type of integrated circuit, it is demanded to improve not only characteristics of the switch circuit alone, but also characteristics of the entire integrated circuit, such as an insertion loss and isolation. Therefore, some integrated circuit is constituted as a semiconductor switch device in which a depletion-type FET (hereinafter referred to as a "D-type FET") and an enhancement-type FET (hereinafter referred to as an "E-type FET") are formed on a single semiconductor substrate in a mixed way. For example, see Japanese Unexamined Patent Application Publication No. 2005-203642 (PTL 1). The D-type FET has a normally-on characteristic that a threshold voltage is negative when a drain current starts to flow, and it is featured in having a smaller insertion loss than the E-type FET. The D-type FET is used in many switch circuits. The E-type FET has a normally-off characteristic that a threshold voltage is positive when a drain current starts to flow, and it is used in many amplification circuits and many logic circuits.

SUMMARY

The present disclosure provides a semiconductor switch device having an improved distortion characteristic, and a method of manufacturing the semiconductor switch device.

In one aspect, a semiconductor switch device includes a plurality of semiconductor elements, e.g., an E-type FET and a D-type FET, formed on a semiconductor substrate and constituting a switch circuit and a connection circuit, e.g., a logic circuit, connected to the switch circuit. Each of the semiconductor elements includes recess, a gate electrode portion including a gate electrode, a drain electrode portion including a drain electrode, and a source electrode portion including a source electrode. The gate electrode forming portion is arranged between the drain electrode portion and the source electrode portion. The switch circuit is constituted by at least one of the semiconductor elements in which the gate electrode has a rectangular external shape in section. The connection circuit includes at least one of the semiconductor elements in which the gate electrode has an external shape other than being rectangular in section.

In a more specific embodiment, the recess may have a multi-stepped shape including a first recess portion and a second recess portion deeper than the first recess portion, the second recess portion having a recess width smaller than a recess width of the first recess portion.

In another more specific embodiment, a ratio of the recess width of the second recess portion to the recess width of the first recess portion is larger in the semiconductor element including the rectangular gate than in the semiconductor element including the V-shaped gate and the T-shaped gate.

In another aspect of the disclosure, a semiconductor switch device includes a plurality of semiconductor elements formed on a single semiconductor substrate with provision of recesses for the semiconductor elements. The plurality of semiconductor elements are used to constitute a switch circuit and a connection circuit connected to the switch circuit. Each of the semiconductor elements comprises a gate electrode forming portion, a drain electrode forming portion, and a source electrode forming portion including respectively a gate electrode, a drain electrode, and a source electrode. The gate electrode forming portion is arranged between the drain electrode forming portion and the source electrode forming portion. The recess has a multi-stepped shape including a first recess portion and a second recess portion deeper than the first recess portion, the second recess portion having a recess width smaller than a recess width of the first recess portion. A ratio of the recess width of the second recess portion to the recess width of the first recess portion is larger in the semiconductor element constituting the switch circuit than in the semiconductor element constituting the connection circuit.

In a more specific embodiment, the recess width of the second recess is larger in the semiconductor element including the gate electrode having the rectangular sectional shape than in the semiconductor element including the gate electrode having the sectional shape other than being rectangular.

In another more specific embodiment, an amplification circuit provided with the semiconductor element including a gate having a shape other than rectangular can be formed on the semiconductor substrate.

In another aspect of the disclosure, a manufacturing method includes forming rectangular gate after forming the gate electrode having a sectional shape other than rectangular.

DESCRIPTION OF EMBODIMENTS

The inventors recognized that a third-generation cellular phone system faces a serious problem in that intermodulation distortion enters a reception path and causes a reception error in addition to harmonic distortion (signal distortion), which has so far been a problem in the second-generation cellular phone system. The intermodulation distortion is generated by mixing of jamming waves and transmitted waves, which exist in air. Thus, in the third-generation cellular phone system, the distortion characteristic that has not been taken into consideration as a problem in the second-generation cellular phone system is an important characteristic, and improvement of the distortion characteristic with reduction of both the harmonic distortion and the intermodulation distortion is demanded.

The inventors of this application have found that linearity of a capacitance characteristic in the FET constituting a switch circuit greatly affects the distortion characteristic, and the present disclosure addresses that finding.

A semiconductor switch device according to a first exemplary embodiment will now be described in connection with FIG. 1, which depicts an example in which an FET is formed as a semiconductor element. It is to be noted that embodiments also can be applied to the case using an HEMT (high Electron Mobility Transistor) as one type of FET.

Figure 1:
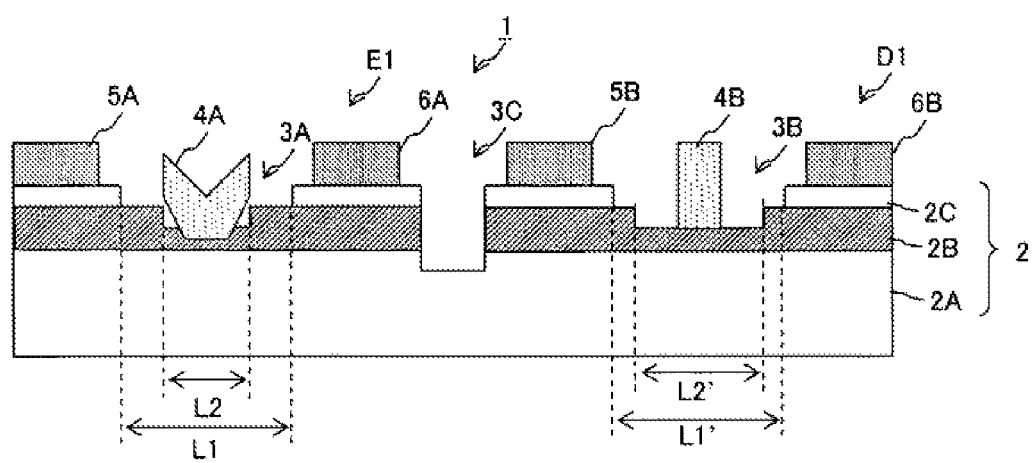
FIG. 1 is a schematic sectional view of a semiconductor switch device according to a first exemplary embodiment.

FIG. 1 is a schematic sectional view of the semiconductor switch device 1. The semiconductor switch device 1 includes a plurality of semiconductor elements including at least two types of semiconductor elements E1 and D1. FIG. 1 illustrates an exemplary construction in which the semiconductor element E1 and the semiconductor element D1 are formed side by side.

The semiconductor switch device 1 includes a semiconductor substrate 2, gate electrodes 4A and 4B, source electrodes 5A and 5B, and drain electrodes 6A and 6B. The semiconductor substrate 2 includes a GaAs layer 2A as a semiconductor layer, a channel layer 2B epitaxially grown on the GaAs layer 2A, and a contact layer 2C epitaxially grown on the channel layer 2B.

The semiconductor substrate 2 includes a groove 3C that is formed by partly removing the contact layer 2C, the channel layer 2B, and the GaAs layer 2A. The groove 3C delimits a region where one semiconductor element is formed, and it makes the GaAs layer 2A exposed to the outside.

The semiconductor substrate 2 includes recesses 3A and 3B, which are formed by partly removing the contact layer 2C, in the regions where the semiconductor elements are formed, respectively. The recesses 3A and 3B make the channel layer 2B exposed to the outside.

The source electrodes 5A and 5B and the drain electrodes 6A and 6B are formed on the contact layer 2C at positions corresponding to respective ridges aside on both sides of the recesses 3A and 3B, respectively. The source electrodes 5A and 5B and respective portions of the contact layer 2C just thereunder constitute source electrode forming portions in the present disclosure. The drain electrodes 6A and 6B and respective portions of the channel layer 2B just thereunder constitute drain electrode forming portions in the present disclosure.

The gate electrodes 4A and 4B are formed on bottom surfaces of the recesses 3A and 3B. The gate electrode 4A is formed in a state partly buried in the channel layer 2B, and the gate electrode 4B is formed on the channel layer 2B. Each of portions of the gate electrodes 4A and 4B, which project respectively from the bottom surface of the recesses 3A and 3B, constitutes a gate electrode forming portion in the present disclosure.

The semiconductor element E1 is an E-type FET and is made up of the semiconductor substrate 2, the gate electrode 4A, the source electrode 5A, and the drain electrode 6A. The gate electrode 4A is a V-shaped gate formed to have a V-shape in section (hereinafter referred to as a "V-shaped gate 4A"). The recess 3A is formed in the region of the semiconductor substrate 2 where the semiconductor element E1 is formed. The recess 3A has two steps in sectional shape, which are constituted by a first recess portion formed by processing the contact layer 2C and a second recess portion formed by processing the channel layer 2B. A recess width L1 of the first recess portion is larger than a recess width L2 of the second recess portion.

The semiconductor element D1 is a D-type FET and is made up of the semiconductor substrate 2, the gate electrode 4B, the source electrode 5B, and the drain electrode 6B. The gate electrode 4B is a rectangular gate formed to have a rectangular shape in section (hereinafter referred to as a "rectangular gate 4B"). The recess 3B is formed in the region of the semiconductor substrate 2 where the semiconductor element D1 is formed. The recess 3B has two steps in sectional shape, which are constituted by a first recess portion formed by processing the contact layer 2C and a second recess portion formed by processing the channel layer 2B. A recess width L1' of the first recess portion is larger than a recess width L2' of the second recess portion.

In the semiconductor element D1 of this embodiment, because the rectangular gate 4B is employed, its surface area can be reduced. Comparing with the case employing a V-shaped gate or a T-shaped gate, therefore, a stray capacitance component generated between the semiconductor substrate 2 and each of the source electrode 5B and the drain electrode 6B can be reduced. Further, the recess width L2' for the semiconductor element D1 is set larger than the recess width L2 for the semiconductor element E1 such that a potential gradient in the channel layer 2B is moderated and linearity of a capacitance characteristic is improved. On the other hand, in the semiconductor element E1, a decrease of an amplification rate and an increase of an impedance component are suppressed by employing the V-shaped gate.

The capacitance characteristic of a semiconductor element is now described in connection with, by way of example, the D-type FET.

Figure 2A:
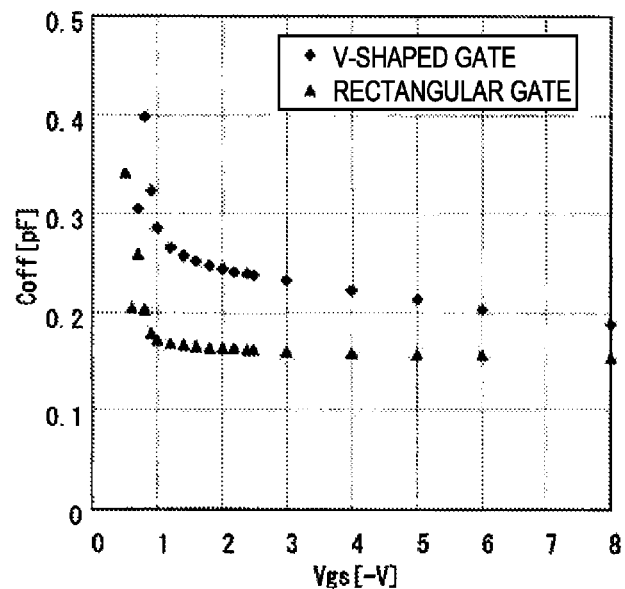
FIG. 2 represents characteristic graphs of the semiconductor switch device illustrated in FIG. 1.

FIG. 2A is a graph plotting the relationship between a source-drain capacitance Coff and a gate-source voltage Vgs in an off-state of the D-type FET. The graph comparatively plots the case employing a rectangular gate as the D-type FET and the case employing a V-shaped gate as the D-type FET. Further, the gate-source voltage Vgs is represented in terms of the so-called inverse voltage.

As seen from the graph of FIG. 2A, the capacitance Coff in the case employing the rectangular gate is always smaller than the capacitance Coff in the case employing the V-shaped gate, and the stray capacitance component between the gate electrode and each of the drain electrode and the source electrode can be suppressed.

Also, from the graph of FIG. 2A, it can be confirmed that the rectangular gate provides a smaller slope of change in the capacitance Coff than the V-shaped gate in a region where the voltage Vgs is larger than a pinch-off voltage of about 0.8 V. Thus, it can be confirmed that, by employing the rectangular gate and increasing the recess width of the first recess portion, bias dependency of the capacitance Coff can be moderated and the linearity can be improved.

Figure 2B:
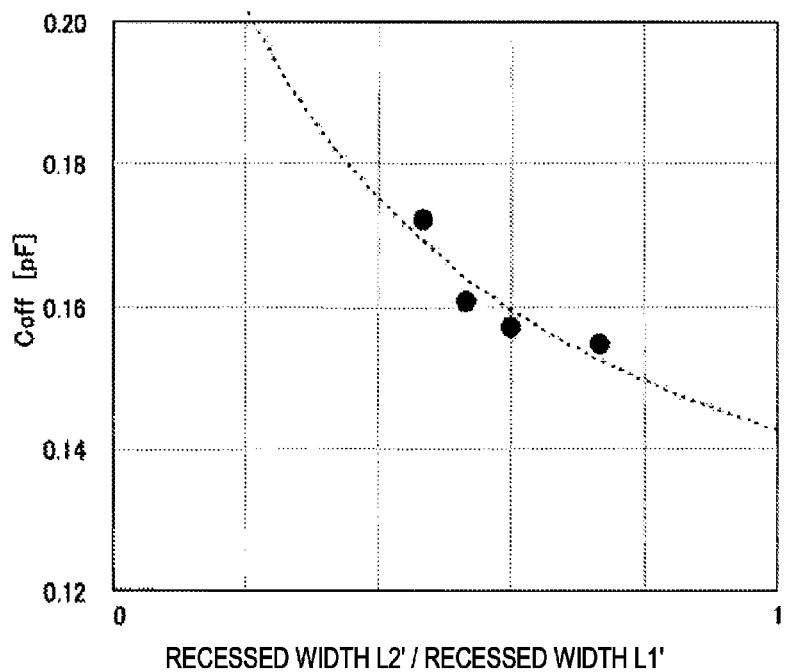

FIG. 2B is a graph plotting the relationship between the source-drain capacitance Coff and L2'/L1', i.e., a ratio of the recess width of the second recess portion to the recess width of the first recess portion in the two-stepped recess for the rectangular gate. FIG. 2B comparatively represents data while the gate-source voltage Vgs is kept at the same condition.

As seen from the graph of FIG. 2B, the capacitance Coff decreases as the recess width ratio L2'/L1' increases. Thus, it is understood that the capacitance Coff can be reduced by increasing the recess width of the second recess portion.

While the above description has been made on data obtained at different recess width ratios in the rectangular gate, the confirmed relationship is held regardless of the gate shape. It is therefore preferable to set the recess width ratio in a semiconductor element in which the capacitance Coff is to be reduced, such as a semiconductor element constituting a switch circuit, to be larger than the recess width ratio in another semiconductor element in which the necessity of reducing the capacitance Coff is relatively low.

With the arrangement described above, the linearity of the capacitance characteristic in the semiconductor element constituting the switch circuit can be improved. Further, with the a ratio of the recess width of the second recess portion to the recess width of the first recess portion is larger in one of the semiconductor elements constituting the switch circuit than in one of the semiconductor elements constituting a connection (e.g., logic) circuit, the increase of resistance in the channel region of the semiconductor element can be suppressed in the connection circuit while the distortion characteristic of the semiconductor element can be reliably improved in the switch circuit.

One example of circuit configuration of the semiconductor switch device 1 will be described below.

Figure 3A:
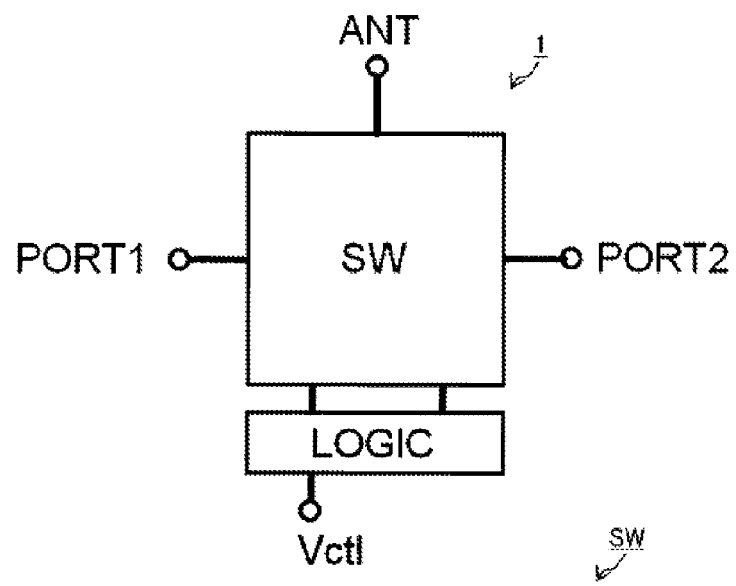
FIG. 3 represents schematic circuit diagrams of the semiconductor switch device illustrated in FIG. 1.

FIG. 3A is a schematic circuit diagram showing an exemplary configuration of the semiconductor switch device 1. The semiconductor switch device 1 includes a switch circuit SW and a logic circuit LOGIC.

Figure 3B:
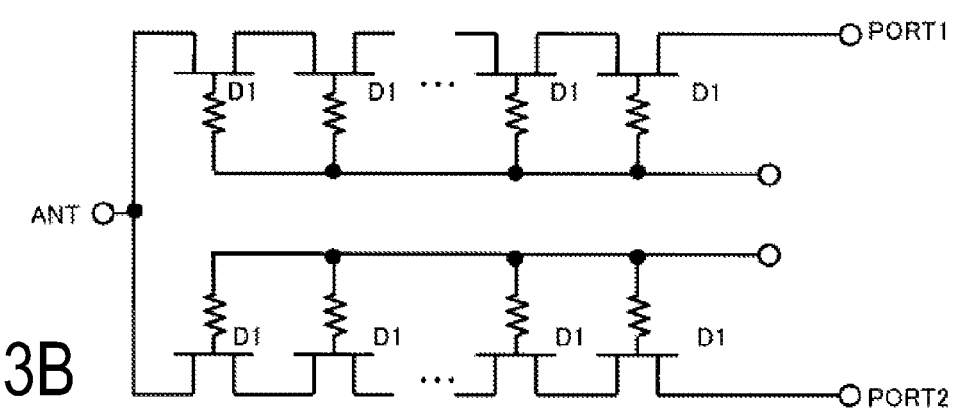

FIG. 3B is a schematic circuit diagram showing an exemplary configuration of the switch circuit SW. The switch circuit SW is constituted by a plurality of semiconductor elements D1, and it has input/output ports PORT1 and PORT2 and an antenna port ANT. In the switch circuit SW, each semiconductor element D1 is turned on or off in accordance with a control voltage input to a control terminal, whereby connection of the input/output port PORT1 or PORT2 to the antenna port ANT is selected.

Here, it is supposed that all semiconductor elements constituting the switch circuit SW are the semiconductor elements D1 including the rectangular gates 4B. Thus, the linearity is improved in the capacitance characteristic of each semiconductor element D1, and the switch circuit SW has a very good distortion characteristic.

Figure 3C:
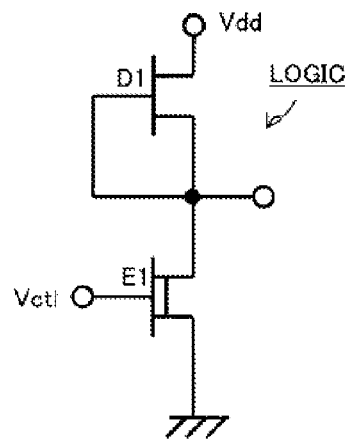

FIG. 3C is a schematic circuit diagram showing an exemplary configuration of the logic circuit LOGIC. The logic circuit LOGIC is constituted by the semiconductor element D1 and the semiconductor element E1. The logic circuit LOGIC outputs a voltage of a logic level to the control terminal of the switch circuit SW in accordance with a control voltage Vct1 that is input to an input port the logic circuit LOGIC.

In the illustrated logic circuit LOGIC, since the semiconductor element E1 including the V-shaped gate is employed, the decrease of the amplification rate and the increase of the impedance component can be suppressed in amounts corresponding to the use of the semiconductor element E1 in comparison with the case where all the gate electrode forming portions of the semiconductor elements E1 are formed to be rectangular in section.

An exemplary process for manufacturing the semiconductor switch device 1 will now be described with reference to FIGS. 4A to 4G.

Figure 4A:
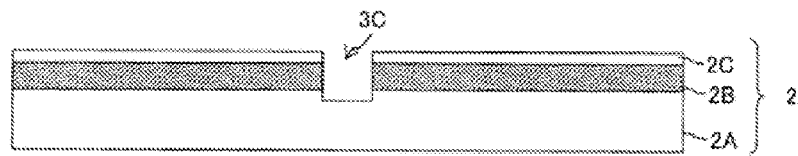
FIG. 4 represents sectional views illustrating states in successive steps of a manufacturing process for the semiconductor switch device illustrated in FIG. 1.

FIG. 4A is a sectional view illustrating a state during a region dividing step in the manufacturing process.

In this step, the groove 3C is formed at each of positions partitioning a plurality of semiconductor elements in the semiconductor substrate 2. More specifically, the semiconductor substrate 2 having a flat plate shape and including the GaAs layer 2A, the channel layer 2B, and the contact layer 2C is first prepared. Then, the groove 3C is formed by etching, for example, with a depth extending from the contact layer 2C up to the GaAs layer 2A. After completion of the region dividing step, the manufacturing process advances to a next ohmic electrode forming step.

Figure 4B:
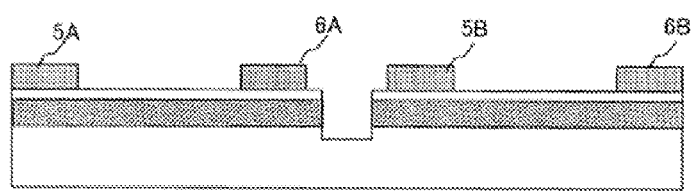

FIG. 4B is a sectional view illustrating a state during the ohmic electrode forming step in the manufacturing process.

In this step, ohmic electrodes serving as the drain electrodes 6A and 6B and the source electrode 5A and 5B are formed in the regions individually delimited by the groove 3C. The ohmic electrodes are each formed by metal vapor deposition. After completion of the ohmic electrode forming step, the manufacturing process advances to a next common etching step.

Figure 4C:
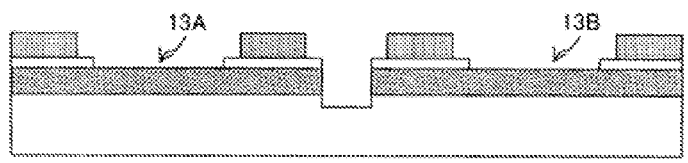

FIG. 4C is a sectional view illustrating a state during the common etching step in the manufacturing process.

In this step, respective first recess portions 13A and 13B of the recesses 3A and 3B are formed. More specifically, a resist film is first formed by photolithography. Next, the contact layer 2C is partly removed by wet etching or dry etching. Thereafter, the resist film is removed. After completion of the common etching step, the manufacturing process advances to a next E-type FET etching step.

Figure 4D:
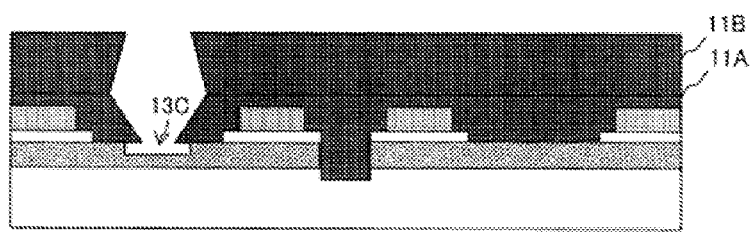

FIG. 4D is a sectional view illustrating a state during the E-type FET etching step in the manufacturing process.

In this step, the second recess portion 13C of the recess 3A is formed. More specifically, a resist film 11A is first formed on the semiconductor substrate 2 by photolithography. A resist window having a taper in match with the shape of a lower surface of the V-shaped gate 4A is formed in the resist film 11A. Further, a resist film 11B is formed over the resist film 11A by photolithography. A resist window having an opening in match with the shape of the V-shaped gate 4A, as viewed from above, is formed in the resist film 11B. Then, the channel layer 2B is partly removed by, e.g., wet etching or dry etching. After completion of the E-type FET etching step, the manufacturing process advances to a next E-type FET gate electrode forming step.

Figure 4E:
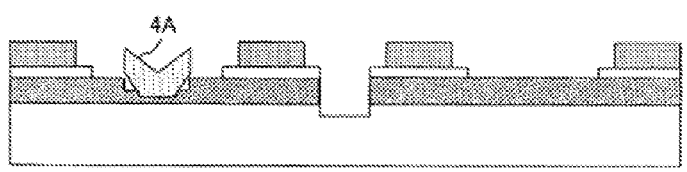

FIG. 4E is a sectional view illustrating a state during the E-type FET gate electrode forming step in the manufacturing process.

In this step, the V-shaped gate 4A is formed. More specifically, metal vapor deposition is first carried out by utilizing the resist films 11A and 11B, which have been formed in the preceding step. Thereafter, the resist films 11A and 11B are removed. Thus, a process of forming the resist films is curtailed by utilizing the resist films, which have been employed in the preceding step, to form the V-shaped gate 4A in this E-type FET gate electrode forming step as well. After completion of the E-type FET gate electrode forming step, the manufacturing process advances to a next D-type FET etching step.

Figure 4F:
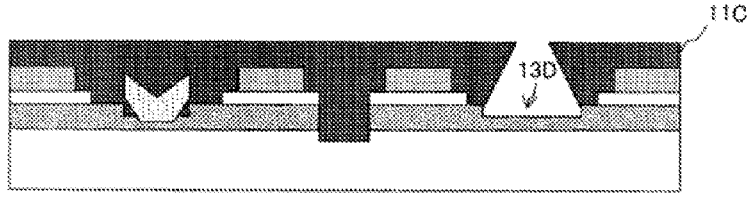

FIG. 4F is a sectional view illustrating a state during the D-type FET etching step in the manufacturing process.

In this step, the second recess portion 13D of the recess 3B is formed. More specifically, a resist film 11C is first formed on the semiconductor substrate 2 by photolithography. A resist window having an opening in match with the shape of the rectangular gate 4B, as viewed from above, is formed in the resist film 11C. Then, the channel layer 2B is partly removed by, e.g., wet etching or dry etching. After completion of the D-type FET etching step, the manufacturing process advances to a next D-type FET gate electrode forming step.

Figure 4G:
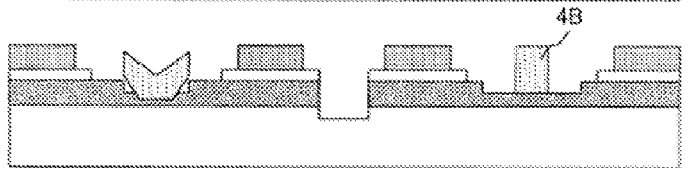

FIG. 4G is a sectional view illustrating a state during the D-type FET gate electrode forming step in the manufacturing process.

In this step, the rectangular gate 4B is formed. More specifically, metal vapor deposition is first carried out by utilizing the resist film 11C, which has been formed in the preceding step. Thereafter, the resist film 11C is removed. Thus, a process of forming the resist film is curtailed by utilizing the resist film, which has been employed in the preceding step, to form the rectangular gate 4B in this D-type FET gate electrode forming step as well.

The semiconductor switch device 1 is manufactured by the above-described manufacturing process. With this embodiment, since the rectangular gate 4B is formed after forming a non-rectangular gate, e.g., a V-shaped or T-shaped gate, that requires a relatively long and/or complicated manufacturing process, an influence of the steps of forming the semiconductor element in a later stage upon the semiconductor element formed in an earlier stage can be suppressed even when the different types of semiconductor elements are formed in sequence. Additionally, a risk of damaging the rectangular gate due to, e.g., heat generated in the manufacturing process of the V-shaped gate and/or the T-shaped gate is increased. The possible damage can be suppressed by forming the rectangular gate, which is relatively simple in the manufacturing process, in a later stage.

In the arrangement described above, a stray capacitance component is reduced in the gate electrode having the rectangular sectional shape (hereinafter referred to as a "rectangular gate") as compared with a gate electrode having a V-shape or T-shape in section (hereinafter referred to as a "V-shaped or T-shaped gate"). The stray capacitance component remains after turning-off of a switch circuit and causes leakage of a high-frequency signal, thus degrading a distortion characteristic of the switch circuit. Further, the rectangular gate enables the recess to be formed in a larger width than the V-shaped gate and the T-shaped gate, for example. By forming the recess in a larger width, when the switch circuit is turned off, potential gradients between the gate electrode and the source electrode and between the gate electrode and the drain electrode can be moderated and linearity of the capacitance characteristic in the D-type FET can be improved. As a result, the distortion characteristic of the switch circuit can be improved.

There is a risk that the larger recess width may increase resistance in a channel region. In the third-generation cellular phone system to which embodiments of the present disclosure can be applied, however, it is more important to improve the distortion characteristic than to reduce the resistance in the channel region. In the present disclosure, therefore, the rectangular gate enabling the recess width to be more easily increased is employed in the switch circuit in which increasing the recess width is effective in improving the distortion characteristic. On the other hand, in the connection circuit in which the effect of an increase of the recess width upon the distortion characteristic is less important, the V-shaped gate or the T-shaped gate is formed to suppress an increase of resistance in the channel region of the E-type FET. Herein, the term "recess" implies a groove formed between the drain electrode forming portion and the source electrode forming portion and having a recessed sectional shape. The term "recess width" implies a width of the groove.

A semiconductor switch device 21 according to a second exemplary embodiment will now be described with reference to FIG. 5. In the following, the same components as those in the first exemplary embodiment are denoted by the same symbols, and description of those components is given above.

In embodiments in which the recess has a multi-stepped shape including a first recess portion and a second recess portion deeper than the first recess portion, the second recess portion having a recess width smaller than a recess width of the first recess portion, the stray capacitance component generated in the recess can be further reduced, and the linearity of the capacitance characteristic in the semiconductor element can be improved.

In embodiments in which a ratio of the recess width of the second recess portion to the recess width of the first recess portion is larger in the semiconductor element including the rectangular gate than in the semiconductor element including a gate shape other than rectangular (e.g., a V-shaped gate or a T-shaped gate), the increase of resistance in the channel region of the semiconductor element can be suppressed in the connection circuit while the distortion characteristic of the semiconductor element can be reliably improved in the switch circuit.

Figure 5:
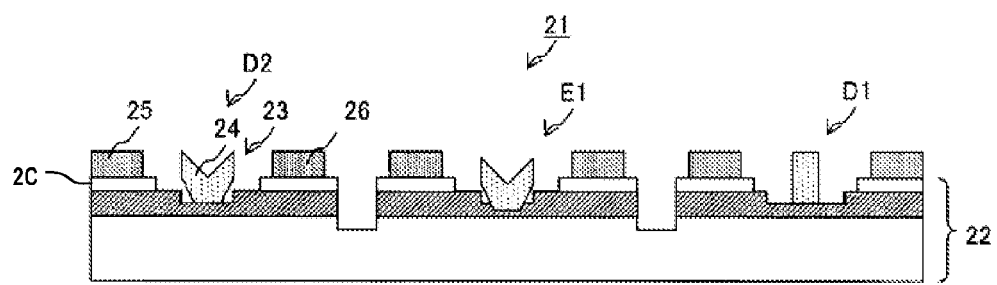
FIG. 5 is a schematic sectional view of a semiconductor switch device according to a second exemplary embodiment.

FIG. 5 is a schematic sectional view of the semiconductor switch device 21. The semiconductor switch device 21 includes a plurality of semiconductor elements including at least three types of semiconductor elements E1, D1 and D2.

The semiconductor element D2 is a D-type FET and is made up of a semiconductor substrate 22, a gate electrode 24, a source electrode 25, and a drain electrode 26. The gate electrode 24 is a V-shaped gate formed to have a V-shape in section (hereinafter referred to as a "V-shaped gate 24"). By partly removing the contact layer 2C, a recess 23 is formed in a region of the semiconductor substrate 22 where the semiconductor element D2 is formed. The recess 23 has two steps in sectional shape and has a recess width in the same size as that for the semiconductor element E1. The source electrode 25 and the drain electrode 26 are formed on the contact layer on both sides of the recess 23.

Since the V-shaped gate 24 is employed in the semiconductor element D2 of this embodiment, the recess width L2 is reduced in comparison with the case employing the rectangular gate. As a result, the decrease of the amplification rate and the increase of the impedance component can be suppressed in the semiconductor element D2.

One example of circuit configuration of the semiconductor switch device 1 will now be described.

Figure 6A:
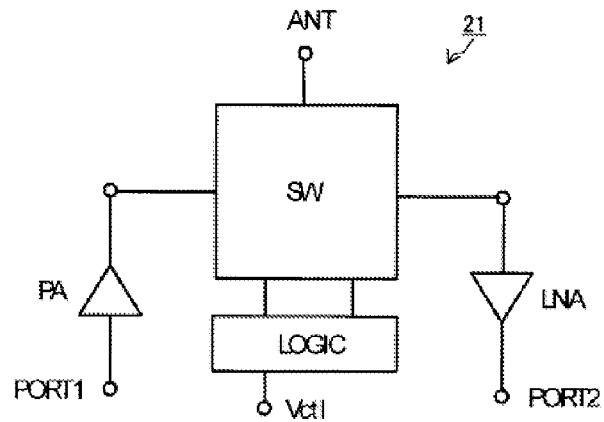
FIG. 6 represents schematic circuit diagrams of the semiconductor switch device illustrated in FIG. 5.

FIG. 6A is a schematic circuit diagram showing an exemplary configuration of the semiconductor switch device 21. The semiconductor switch device 21 includes a switch circuit SW, a logic circuit LOGIC, a power amplifier PA, and a low-noise amplifier LNA.

Figure 6B:
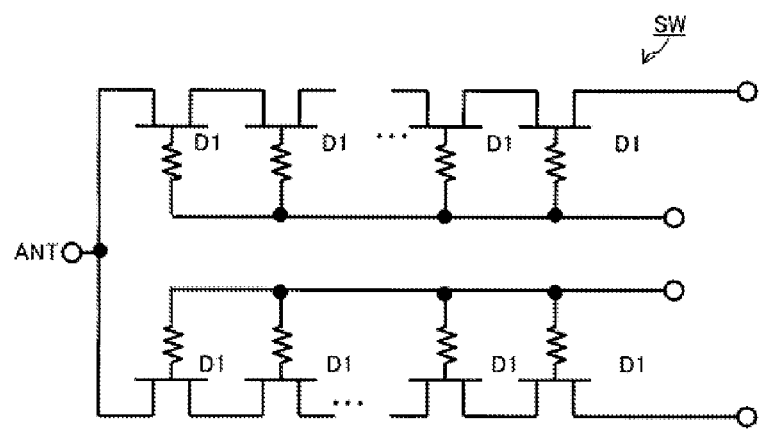

FIG. 6B is a schematic circuit diagram showing an exemplary configuration of the switch circuit SW. The switch circuit SW is constituted by a plurality of semiconductor elements D1.

Here, it is supposed that all semiconductor elements constituting the switch circuit SW are the semiconductor elements D1 including the rectangular gates 4B. Thus, the linearity is improved in the capacitance characteristic of each semiconductor element D1, and the switch circuit SW has a very good distortion characteristic.

Figures 6C, 6D:
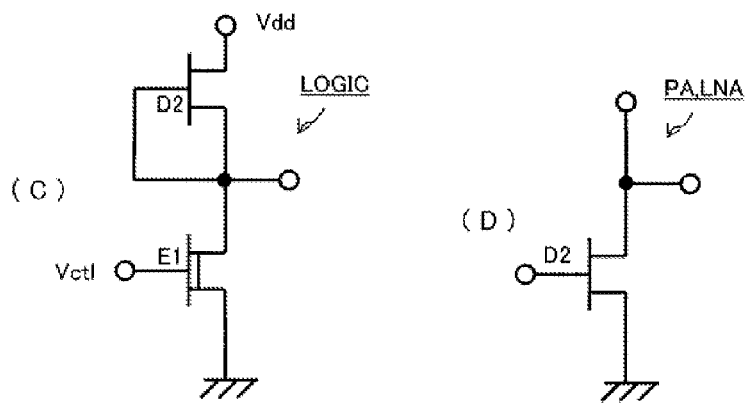

FIG. 6C is a schematic circuit diagram showing an exemplary configuration of the logic circuit LOGIC. The logic circuit LOGIC is constituted by the semiconductor element D2 and the semiconductor element E1. The logic circuit LOGIC outputs a voltage of a logic level to a control terminal of the switch circuit SW in accordance with a control voltage Vct1 that is input to an input port of the logic circuit LOGIC.

In this embodiment, since the logic circuit LOGIC is constituted by the semiconductor elements E1 and D2 each including the V-shaped gate, the decrease of the amplification rate and the increase of the impedance component can be suppressed corresponding to the use of the semiconductor elements E1 and D2.

FIG. 6D is a schematic circuit diagram showing an exemplary configuration of the power amplifier PA and the low-noise amplifier LNA. Each of the power amplifier PA and the low-noise amplifier LNA is constituted by the semiconductor element D2. Accordingly, the decrease of the amplification rate and the increase of the impedance component can be suppressed corresponding to the use of the semiconductor element D2.

A semiconductor switch device 31 according to a third exemplary embodiment will now be described with reference to FIG. 7. In the following, the same components as those in the first and second embodiments are denoted by the same symbols, and description of those components is given above.

Figure 7:
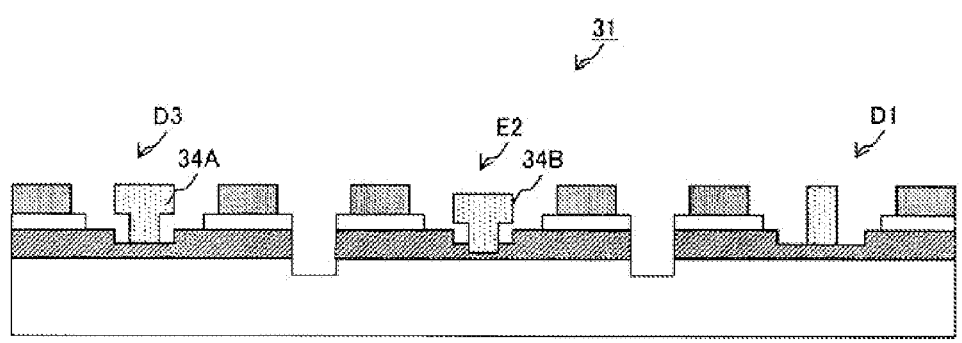
FIG. 7 is a schematic sectional view of a semiconductor switch device according to a third exemplary embodiment.

FIG. 7 is a schematic sectional view of the semiconductor switch device 31. The semiconductor switch device 31 includes a plurality of semiconductor elements including at least three types of semiconductor elements E2, D1 and D3.

The semiconductor element D3 is a D-type FET, and it includes a gate electrode 34A. The semiconductor element E2 is an E-type FET, and it includes a gate electrode 34B. The gate electrodes 34A and 34B are each a T-shaped gate formed to have a T-shape in section.

Even when the T-shaped gate 24 is employed instead of the V-shaped gate as in this embodiment, the decrease of the amplification rate and the increase of the impedance component in the semiconductor element can be suppressed by minimizing the recess width for the T-shaped gate as in the case employing the V-shaped gate.

A semiconductor switch device 41 according to a fourth exemplary embodiment will now be described with reference to FIG. 8. In the following, the same components as those in the first to third embodiments are denoted by the same symbols, and description of those components is given above.

Figure 8:
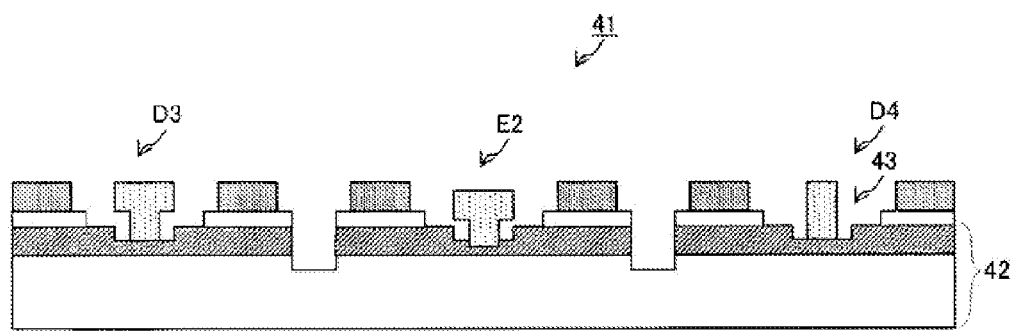
FIG. 8 is a schematic sectional view of a semiconductor switch device according to a fourth exemplary embodiment.

FIG. 8 is a schematic sectional view of the semiconductor switch device 41. The semiconductor switch device 41 includes a plurality of semiconductor elements including at least three types of semiconductor elements E2, D4 and D3.

The semiconductor element D4 is a D-type FET including a rectangular gate, and it includes a semiconductor substrate 42 in which a recess 43 is formed. The recess 43 is formed such that its recess width has the same size as that for each of the semiconductor element D3 and the semiconductor element E2. Such a structure of the semiconductor element D4 is employed in the semiconductor element constituting the switch circuit SW.

Even when the recess width is set to be the same for all the semiconductor elements as in this embodiment, the distortion characteristic of the switch circuit can be improved by employing the T-shaped gate, the V-shaped gate, and the rectangular gate in a combined manner.

In embodiments including an amplification circuit with a semiconductor element including the V-shaped gate or the T-shaped gate in the semiconductor substrate, the amplification circuit can be formed in an integrated state on the semiconductor substrate, whereby a degree of integration in the circuit configuration can be increased and some steps in a manufacturing process can be performed in common.

Embodiments according to the present disclosure can improve the linearity of the capacitance characteristic in the semiconductor element while suppressing a decrease of an amplification rate and an increase of an impedance component. It is hence possible to improve the distortion characteristic and to suppress, e.g., the occurrence of a reception error in the third-generation cellular phone system.

While exemplary embodiments have been described above, it is to be understood that variations and modifications will be apparent to those skilled in the art without departing from the scope and spirit of the disclosure.

That which is claimed is:

1. A semiconductor switch device including a plurality of semiconductor elements on a semiconductor substrate and constituting a switch circuit and a connection circuit connected to the switch circuit,
    each of the semiconductor elements comprising:
    a recess;
    a source electrode portion including a source electrode;
    a drain electrode portion including a drain electrode; and
    a gate electrode portion including a gate electrode projecting from a bottom surface of the recess and arranged between the drain electrode portion and the source electrode portion,
    wherein the switch circuit is constituted by at least one of the semiconductor elements in which the gate electrode has a rectangular external shape in section,
    the connection circuit includes at least one of the semiconductor elements in which the gate electrode has an external shape other than being rectangular in section,
    the recess has a multi-stepped shape including a first recess portion formed between the drain electrode portion and the source electrode portion, and a second recess portion formed around the gate electrode portion to be deeper than the first recess portion, the second recess portion having a recess width smaller than a recess width of the first recess portion,
    a ratio of the recess width of the second recess portion to the recess width of the first recess portion is larger in the semiconductor element including the gate electrode having a rectangular sectional shape than in the semiconductor element including the gate electrode having a sectional shape other than being rectangular, and
    a distance between an edge of the gate electrode of the switch circuit and an edge of the second recess portion of the switch circuit is larger than a distance between an edge of the gate electrode of the connection circuit and an edge of the second recess portion of the connection circuit.

2. The semiconductor switch device according to claim 1, wherein the recess width of the second recess portion is larger in the semiconductor element including the gate electrode having the rectangular sectional shape than in the semiconductor element including the gate electrode having the sectional shape other than being rectangular.

3. The semiconductor switch device according to claim 1, wherein the semiconductor element constituting the switch circuit is a depletion-type FET.

4. The semiconductor switch device according to claim 1, wherein an amplification circuit including at least one of the semiconductor elements including the gate electrode having the sectional shape other than being rectangular is on the semiconductor substrate.

5. A method of manufacturing the semiconductor switch device according to claim 1, the method comprising the step of:
    after forming the gate electrode having the sectional shape other than being rectangular,
    forming the gate electrode having the rectangular sectional shape.

6. A semiconductor switch device including a plurality of semiconductor elements on a semiconductor substrate and constituting a switch circuit and a connection circuit connected to the switch circuit, each of the semiconductor elements comprising:
a recess;
a source electrode portion including a source electrode;
a drain electrode portion including a drain electrode; and
a gate electrode portion including a gate electrode projecting from a bottom surface of the recess and arranged between the drain electrode portion and the source electrode portion,
wherein the recess has a multi-stepped shape including a first recess portion between the drain electrode portion and the source electrode portion, and a second recess portion formed around the gate electrode portion to be deeper than the first recess portion, the second recess portion having a recess width smaller than a recess width of the first recess portion,
a ratio of the recess width of the second recess portion to the recess width of the first recess portion is larger in one of the semiconductor elements constituting the switch circuit than in one of the semiconductor elements constituting the connection circuit, and
a distance between an edge of the gate electrode of the switch circuit and an edge of the second recess portion of the switch circuit is larger than a distance between an edge of the gate electrode of the connection circuit and an edge of the second recess portion of the connection circuit.

7. The semiconductor switch device according to claim 6, wherein the semiconductor element constituting the switch circuit is a depletion-type FET.

8. The semiconductor switch device according to claim 6, wherein an amplification circuit including at least one of the semiconductor elements which includes the gate electrode having a sectional shape other than being rectangular is on the semiconductor substrate.

9. A method of manufacturing the semiconductor switch device according to claim 6, the method comprising the step of:

after forming the gate electrode of one of the semiconductor elements, which has a sectional shape other than being rectangular, forming the gate electrode of another one of the semiconductor elements, which has a rectangular sectional shape.

\* \* \* \* \*